United States Patent
Li et al.

(10) Patent No.: US 11,698,407 B2
(45) Date of Patent: Jul. 11, 2023

(54) TOUCH-CONTROL TEST APPARATUS AND TOUCH-CONTROL TEST METHOD

(71) Applicant: BOE TECHNOLOGY GROUP CO., LTD., Beijing (CN)

(72) Inventors: Lu Li, Beijing (CN); Hangman Lai, Beijing (CN); Shengbao Dun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 244 days.

(21) Appl. No.: 17/047,741

(22) PCT Filed: Apr. 19, 2019

(86) PCT No.: PCT/CN2019/083469
§ 371 (c)(1),
(2) Date: Oct. 15, 2020

(87) PCT Pub. No.: WO2019/201335
PCT Pub. Date: Oct. 24, 2019

(65) Prior Publication Data
US 2021/0109150 A1      Apr. 15, 2021

(30) Foreign Application Priority Data
Apr. 19, 2018   (CN) .......................... 201810355639.X (51) Int. Cl.
*G01R 31/28*      (2006.01)
*G06F 3/041*      (2006.01)

(52) U.S. Cl.
CPC ....... *G01R 31/2829* (2013.01); *G06F 3/0418* (2013.01)

(58) Field of Classification Search
CPC . G01R 31/2829; G01R 31/327; G06F 3/0418; G06F 11/2221; G01M 13/00
See application file for complete search history.

(56) References Cited

U.S. PATENT DOCUMENTS

2014/0320461 A1   10/2014   Motoi et al.

FOREIGN PATENT DOCUMENTS

| CN | 101187685 A | 5/2008 |
|---|---|---|
| CN | 101436109 A | 5/2009 |

(Continued)

OTHER PUBLICATIONS

International Search Report of PCT/CN2019/083469 in Chinese, dated Jul. 18, 2019 with English Translation.

(Continued)

*Primary Examiner* — Robert H Kim
*Assistant Examiner* — Christopher J Gassen
(74) *Attorney, Agent, or Firm* — Collard & Roe, P.C.

(57) ABSTRACT

A touch control test device and a touch control test method are provided, and the touch control test device includes: a telescopic mechanism with an adjustable length; a touch control component connected to the telescopic mechanism so that the telescopic mechanism is configured to drive the touch control component to tap the touch screen; an acquisition unit configured to acquire an actual detection coordinate point where the touch control component taps the touch screen; a calculation unit configured to calculate a touch control coordinate error between a target coordinate point corresponding to the actual detection coordinate point where the touch control component taps the touch screen and the actual detection coordinate point. The touch test device can achieve a tap touch control test of the touch screen.

19 Claims, 3 Drawing Sheets

(56) References Cited

FOREIGN PATENT DOCUMENTS

| | | | |
|---|---|---|---|
| CN | 101533326 A | | 9/2009 |
| CN | 101751179 A | | 6/2010 |
| CN | 102235954 A | | 11/2011 |
| CN | 102879673 A | * | 1/2013 |
| CN | 102879673 A | | 1/2013 |
| CN | 102968217 A | | 3/2013 |
| CN | 103235661 A | | 8/2013 |
| CN | 103383600 A | | 11/2013 |
| CN | 103383601 A | | 11/2013 |
| CN | 103487692 A | | 1/2014 |
| CN | 103954860 A | | 7/2014 |
| CN | 103954860 A | * | 7/2014 |
| CN | 104346018 A | | 2/2015 |
| CN | 104714679 A | | 6/2015 |
| CN | 205408045 U | | 7/2016 |
| CN | 105975132 A | | 9/2016 |
| JP | 4493200 B2 | | 6/2010 |
| KR | 200448253 Y1 | * | 3/2010 |
| KR | 200448253 Y1 | | 3/2010 |
| KR | 200448253 Y1 | * | 3/2021 |

OTHER PUBLICATIONS

International Preliminary Report on Patentability of PCT/CN2019/083469, dated Oct. 20, 2020 and English Translation of the Written Opinion of the International Searching Authority of PCT/CN2019/083469, dated Jul. 18, 2019.

Chinese Office Action in Chinese Application No. 201810355639.X dated Jul. 19, 2021.

* cited by examiner

TOUCH-CONTROL TEST APPARATUS AND TOUCH-CONTROL TEST METHOD

CROSS REFERENCE TO RELATED APPLICATIONS

This application is the National Stage of PCT/CN2019/083469 filed on Apr. 19, 2019, which claims priority under 35 U.S.C. § 119 of Chinese Application No. 201810355639.X filed on Apr. 19, 2018, the disclosure of which is incorporated by reference.

TECHNICAL FIELD

Embodiments of the present disclosure relate to a touch control test device and a touch control test method.

BACKGROUND

With the vigorous development of smart devices, the marketization process of touch screens is gradually accelerating, which is mainly because the touch screen not only meets the needs of people to quickly access information, but also has the advantages of easy interaction. In order to obtain a qualified touch screen, it is usually necessary to test the touch screen.

SUMMARY

Embodiments of the present disclosure provide a touch control test device and a touch control test method, so as to implement the tap touch control test.

On one hand, the embodiments of the present disclosure provide a touch control test device, which comprising: a telescopic mechanism, a length of the telescopic mechanism being adjustable; a touch screen; a touch control component, the touch control component being connected with the telescopic mechanism, so that the telescopic mechanism is configured to drive the touch control component to tap the touch screen; an acquisition unit, configured to acquire an actual detection coordinate point where the touch control component taps the touch screen; and a calculation unit, configured to calculate a touch control coordinate error between a target coordinate point where the touch control component taps the touch screen and the actual detection coordinate point.

For example, for the target coordinate point, the telescopic mechanism is configured to drive the touch control component to tap the touch screen for many times; the acquisition unit is configured to acquire a plurality of actual detection coordinate points where the touch control component taps the touch screen for many times; and the calculation unit is configured to calculate a maximum value of distances between the target coordinate point where the touch control component taps the touch screen and the plurality of actual detection coordinate points, respectively, and the maximum value is the touch control coordinate error when the touch control component taps the touch screen.

For example, the telescopic mechanism comprises a main body and a telescopic portion connected with the main body, the telescopic portion is telescopic and movable relative to the main body, the touch control component is connected with the telescopic portion of the telescopic mechanism, and the telescopic portion is configured to drive the touch control component to tap the touch screen.

For example, in a case where the telescopic mechanism comprises the main body and a telescopic portion connected with the main body, the touch control test device further comprises a moving mechanism, the moving mechanism is connected with the main body of the telescopic mechanism, and the moving mechanism is configured to drive the main body to move at least in a direction parallel to the touch screen.

For example, in a case where the telescopic mechanism comprises the main body and a telescopic portion connected with the main body, the touch control test device comprises a plurality of touch control components, a quantity of a plurality of telescopic mechanisms is the same as a quantity of the plurality of touch control components, and the telescopic portion of each of the plurality of telescopic mechanisms is respectively connected with a respective touch control component; and main bodies of the plurality of telescopic mechanisms are all connected with one moving mechanism.

For example, in a case where the telescopic mechanism comprises the main body and a telescopic portion connected with the main body, the touch control test device comprises a control unit, the plurality of telescopic mechanisms are respectively connected with the control unit, and the control unit is configured to control telescopic portions of the plurality of telescopic mechanisms to alternately stretch and contract in sequence according to a preset order, so as to drive corresponding touch control components to alternately tap the touch screen in sequence according to the preset order.

For example, the touch control test device further comprises a moving mechanism, the moving mechanism is connected with the telescopic mechanism, and the moving mechanism is configured to drive the telescopic mechanism to move at least in a direction parallel to the touch screen.

For example, the touch control test device comprises a plurality of touch control components, a quantity of a plurality of telescopic mechanisms is the same as a quantity of the plurality of touch control components, and each of the plurality of telescopic mechanisms is respectively connected with one of the plurality of touch control components; and the plurality of telescopic mechanisms are all connected with one moving mechanism.

For example, the touch control test device comprises a control unit, the plurality of telescopic mechanisms are respectively connected with the control unit, and the control unit is configured to control the plurality of telescopic mechanisms to alternately stretch and contract in sequence according to a preset order, so as to drive corresponding touch control components to alternately tap the touch screen in sequence according to the preset order.

For example, the touch control test device comprises a plurality of touch control components, a quantity of a plurality of telescopic mechanisms is the same as a quantity of the plurality of touch control components, and each of the plurality of telescopic mechanisms is respectively connected with one of the plurality of touch control components.

For example, the above-mentioned touch control test device further comprises a carrier, and the carrier is configured to place the touch screen.

On the other hand, the embodiments of the present disclosure provide a touch control test method, comprising: controlling a touch control component to tap a touch screen; acquiring an actual detection coordinate point where the touch control component taps the touch screen; and calculating a touch control coordinate error between a target coordinate point where the touch control component taps the touch screen and the actual detection coordinate point.

For example, before controlling the touch control component to tap the touch screen, the touch control test method further comprises: controlling the touch control component to move to a target touch control position relative to the touch screen through a moving mechanism.

For example, the controlling the touch control component to tap the touch screen comprises: controlling a plurality of touch control components to tap the touch screen alternately in sequence according to a preset order.

For example, the acquiring the actual detection coordinate point where the touch control component taps the touch screen, comprises: for the same target coordinate point, acquiring a plurality of actual detection coordinate points where the same touch control component taps the touch screen for many times; calculating the touch control coordinate error between the target coordinate point where the touch control component taps the touch screen and the actual detection coordinate point comprises: according to a calculation formula:

$$D_F = \max(\sqrt{(x_a-x_{r1})^2+(y_a-y_{r1})^2}, \ldots, \sqrt{(x_a-x_{rm})^2+(y_a-y_{rm})^2}),$$

calculating the touch control coordinate error when the touch control component taps the touch screen, where $x_a$ is the target coordinate point where any one touch control component taps the touch screen, and $x_{r1}, \ldots, x_{rm}$ are the plurality of actual detection coordinate points, respectively.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiments, without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, a touch control test method for a touch screen includes: performing a scribing test on the touch screen, that is, performing a touch control test along the parallel direction of the surface of the touch screen. However, the inventor of the present application noticed that in the actual touch control interaction process, the accuracy of the tap touch control response is an important indicator for evaluating the touch control test.

Figure 1:
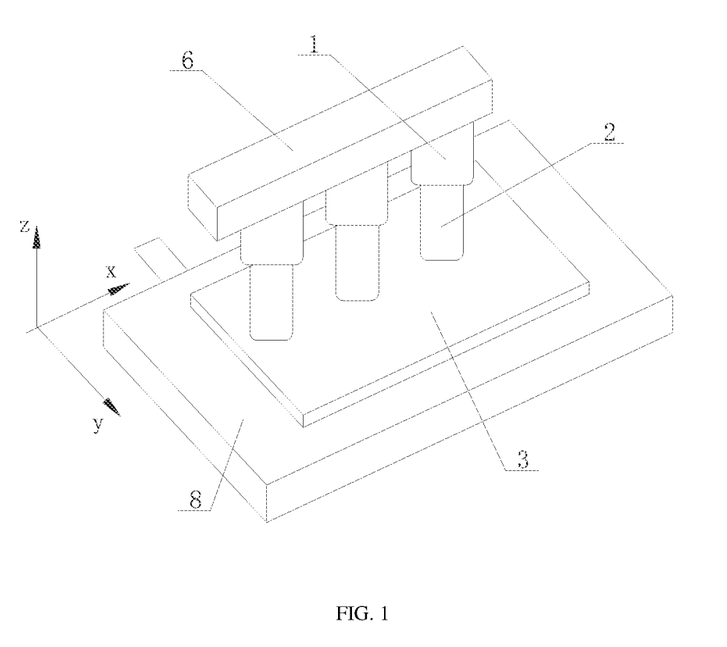
FIG. 1 is a structural schematic diagram of a touch control test device provided by an embodiment of the present disclosure.
Figure 2:
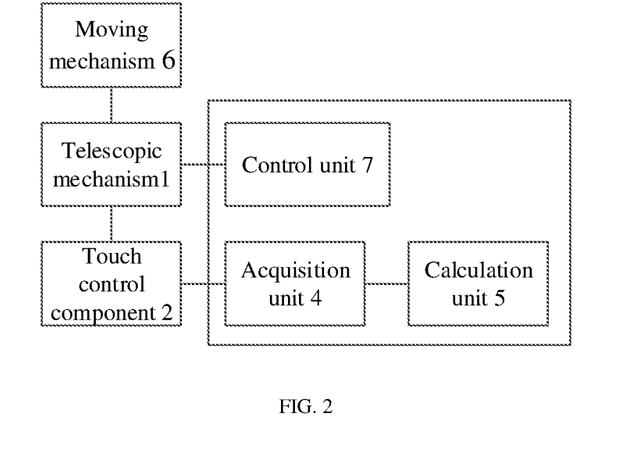
FIG. 2 is a composition block diagram of a touch control test device provided by an embodiment of the present disclosure.

As shown in FIG. 1 and FIG. 2, embodiments of the present disclosure provide a touch control test device, and the touch control test device includes a telescopic mechanism 1, a touch control component 2, a touch screen 3, an acquisition unit 4, and a calculation unit 5. The telescopic mechanism 1 is configured to be adjustable in length. The touch control component 2 is connected with a telescopic portion 1B of the telescopic mechanism 1, and the telescopic portion 1B is configured to drive the touch control component 2 to tap the touch screen 3. The acquisition unit 4 is configured to acquire an actual detection coordinate point where the touch control component 2 taps the touch screen 3 with respect to the same target coordinate point on the touch screen 3. The calculation unit 5 is configured to calculate a touch control coordinate error between the target coordinate point where the touch control component 2 taps the touch screen 3 and the actual detection coordinate point.

Figure 4:
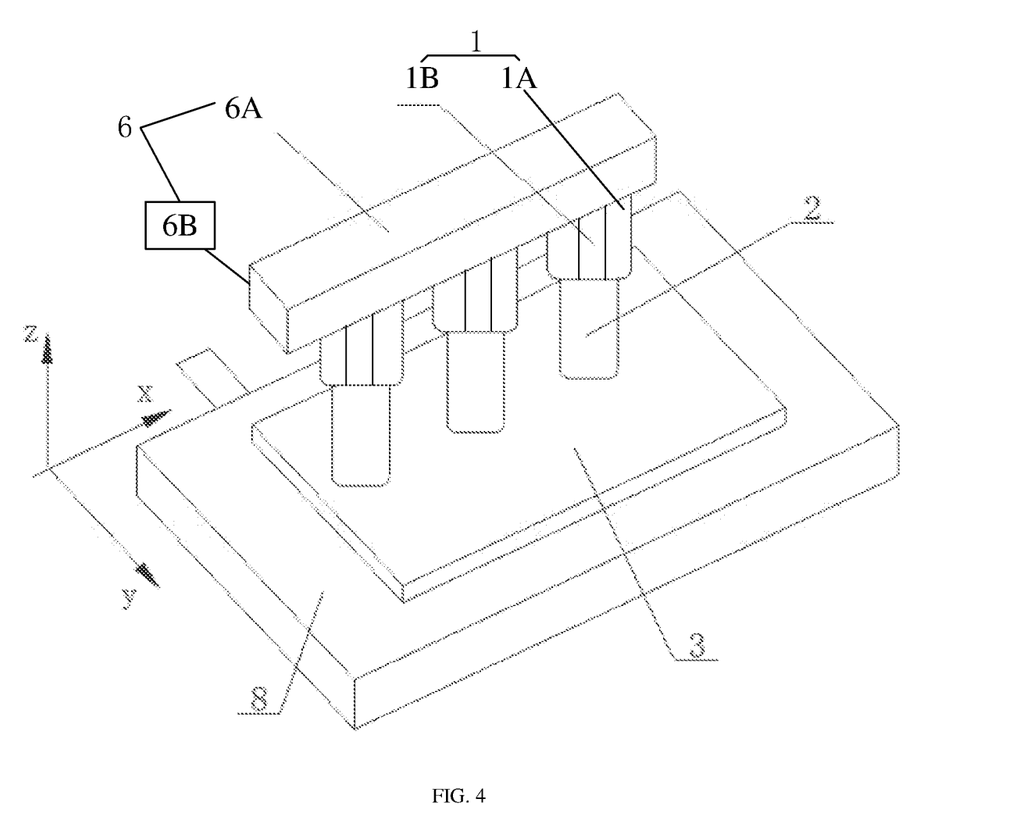
FIG. 4 is a structural schematic diagram of a telescopic mechanism including a main body and a telescopic portion in a touch control test device provided by an embodiment of the present disclosure.

For example, as shown in FIG. 4, the telescopic mechanism 1 includes a main body 1A and a telescopic portion 1B connected with the main body 1A, and the telescopic portion 1B is configured to be telescopic and movable relative to the main body 1A to increase or decrease the length of the telescopic mechanism 1. Moreover, the telescopic mechanism 1 has a simple structure and is conducive to providing more objective and fair results for the accuracy of the touch control test for a touch screen. In this case, for example, the telescopic mechanism 1 can be an electric cylinder or a hydraulic cylinder, or other transmission mechanisms capable of linear reciprocating motion, which is not limited here. Taking the hydraulic cylinder as an example, the cylinder tube of the hydraulic cylinder is the main body, and the piston rod of the hydraulic cylinder is the telescopic portion. In other embodiments, the telescopic mechanism 1 may be other types of mechanisms with adjustable length (for example, electric springs). The number of times, the speed (that is, the speed in a vertical direction), and the time (that is, the time interval for tapping the same target coordinate point), and the like of the telescopic mechanism 1 driving the touch control component 2 to tap the touch screen 3 can be controlled, so as to achieve the test of quick tapping performance in a horizontal direction and a vertical direction in the touch control performance.

The touch control component 2 can be an object (which can also be called a test stick) that can touch on the touch screen 3, and the end portion of the test stick that touches the touch screen 3 can be designed as a convex arc shape, so that the test stick can completely touch the touch screen 3.

In the case where the touch control component 2 taps the touch screen 3, the actual detection coordinate point on the touch screen tapped by the touch control component 2 is acquired by the acquisition unit 4, and there will be a positional deviation between the actual detection coordinate point and the target coordinate point on the touch screen tapped by the touch control component 2, where the target coordinate point is a preset touch position, the touch control component 2 is located above the target coordinate point on the touch screen 3, and then the telescopic mechanism 1 drives the touch control component 2 to tap the touch screen 3. The coordinate point acquired by the acquisition unit 4 when the touch screen 3 is tapped is the actual detection coordinate point. For example, the acquisition unit 4 can be a touch control sensor, etc., as long as the acquisition unit 4 can acquire the actual detection coordinate point of touch, which is not limited here.

The acquired touch control coordinate error between the actual detection coordinate point and the target coordinate point can be calculated by the calculation unit 5. For example, the calculation of the touch control coordinate error can be completed by a processor, and the calculation unit 5 is the calculation logic component of the processor. The touch control coordinate error between the actual detection coordinate point and the target coordinate point is the distance value between the two coordinate points.

According to the touch control test device provided by the embodiments of the disclosure, the touch control component is driven to tap the touch screen through the telescopic mechanism, the actual detection coordinate point on the touch screen tapped by the touch control component is obtained through the acquisition unit, and the touch control coordinate error between the target coordinate point on the touch screen tapped by the touch control component and the actual detection coordinate point is calculated through the calculation unit, so as to achieve the tap touch control test of the touch screen, further improve and perfect the touch control interaction test of the touch screen, and help to provide more objective and fair results for the accuracy of the touch control test for the touch screen.

For example, the telescopic mechanism 1 is configured to drive the touch control component 2 to tap the touch screen 3 for many times. The acquisition unit 4 is configured to acquire a plurality of actual detection coordinate points of the touch screen 3 tapped by the touch control component 2 for many times, and the calculation unit 5 is configured to calculate the maximum value of the distances between the target coordinate point on the touch screen 3 tapped by the touch control component 2 and the actual detection coordinate points, respectively, and the maximum value is the touch control coordinate error when the touch control component 2 taps the touch screen 3. In the case where the touch control component 2 is located above the target coordinate point on the touch screen 3 and taps the touch screen 3 for many times, the acquisition unit 4 acquires a plurality of actual detection coordinate points and transmits the data of the plurality of actual detection coordinate points to the calculation unit 5, and the calculation unit 5 calculates the touch control coordinate error by using the following calculation formula. The calculation formula is:

$$D_F = \max(\sqrt{(x_a - x_{r1})^2 + (y_a - y_{r1})^2}, \ldots, \sqrt{(x_a - x_{rm})^2 + (y_a - y_{rm})^2})$$

where $x_a$ is the target coordinate point on the touch screen tapped by the touch control component, $x_{r1}, \ldots, x_{rm}$ are respectively the plurality of actual detection coordinate points acquired by the acquisition unit. The error values of many touch control interaction responses are calculated, and then the maximum value is selected, thereby making the calculation result more accurate and reliable.

For example, the touch control test device provided by the embodiments of the present disclosure further includes a moving mechanism 6, and the moving mechanism 6 is connected with the telescopic mechanism 1 (for example, connected with the main body 1A of the telescopic mechanism 1), and the moving mechanism 6 is configured to drive the telescopic mechanism 1 (for example, the main body 1A of the telescopic mechanism 1) to move at least in a direction parallel to the touch screen 3. The touch control component 2 connected with the telescopic mechanism 1 can be moved to a position above the target coordinate point on the touch screen 3 by the moving mechanism 6.

For example, as shown in FIG. 4, the moving mechanism 6 may include a moving arm 6A connected with the main body 1A of the telescopic mechanism 1 and a driving mechanism (such as a servo motor, etc.) 6B connected with the moving arm 6A, and the moving position of the moving arm 6A is controlled by the driving mechanism 6B. The embodiments of the present disclosure do not limit the specific structure of the moving mechanism 6, as long as the moving mechanism 6 can move at least in the direction parallel to the touch screen 3. For example, according to the test requirements, the moving mechanism 6 drives the touch control component 2 connected with the telescopic mechanism 1 to move along a preset track, and the moving mechanism 6 can at least move in a direction parallel to the touch screen 3. For example, the moving mechanism 6 moves in an x direction and a y direction. On this basis, for example, the moving mechanism 6 can also be designed to be capable of moving in the direction perpendicular to the touch screen 3, that is, a z direction, so as to adjust the height of the touch control component 2 from the touch screen 3. The moving mechanism 6 can drive the touch control component 2 to perform a scribing test on the touch screen 3, that is, to perform a touch control test along the parallel direction of the surface of the touch screen 3.

For example, the number of the touch control components 2 is plural (the touch control components 2 correspond to different target coordinate points), and the number of a plurality of telescopic mechanisms 1 is the same as the number of the plurality of touch control components 2 for multi-point touch control performance test. For example, as shown in FIG. 1, the plurality of telescopic mechanisms 1 are connected with the moving mechanism 6 and are respectively connected with the plurality of touch control components 2 in one-to-one correspondence. By connecting the plurality of touch control components 2 through the same moving mechanism 6, the plurality of touch control components 2 can be controlled to move in the same horizontal plane to ensure the test in a horizontal direction. For example, as shown in FIG. 4, the telescopic portion 1B of each telescopic mechanism 1 is connected with one touch control component 2. The main bodies 1A of the plurality of telescopic mechanisms 1 are all connected to one moving mechanism 6. The one moving mechanism 6 can drive the plurality of telescopic mechanisms 1 to move relative to the touch screen 3 at the same time, each telescopic mechanism 1 is connected with one touch control component 2, to respectively control each touch control component 2 to tap the touch screen 3 to achieve the multi-point tap touch control operation, and the actions of respective touch control components 2 tapping the touch screen 3 can be mutually unaffected.

Figure 3:
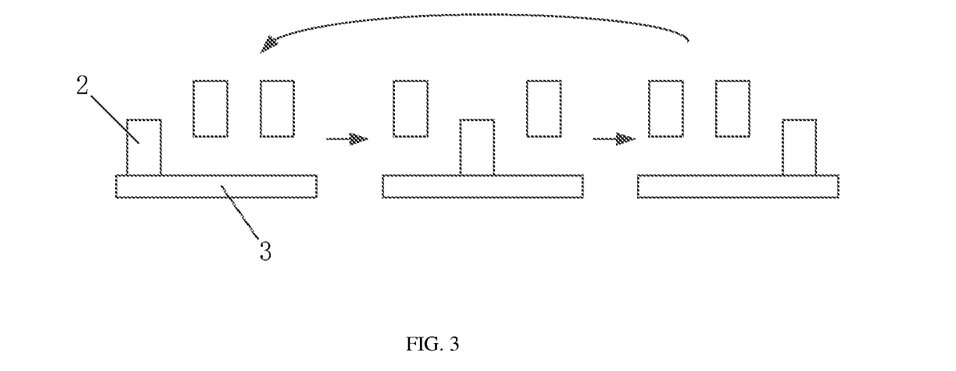
FIG. 3 is a schematic diagram showing a plurality of touch control components, provided by an embodiment of the present disclosure, alternately tapping a touch screen in sequence according to a preset order.

For example, as shown in FIG. 2, the touch control test device includes a control unit 7, a plurality of telescopic mechanisms 1 are respectively connected with the control unit 7, and the control unit 7 is configured to control the plurality of telescopic mechanisms 1 (for example, telescopic portions of the telescopic mechanisms) to alternately stretch and contract in sequence according to a preset order, so as to drive corresponding touch control components 2 to alternately tap the touch screen 3 in sequence according to the preset order. For example, in the case where N touch control components 2 are provided, a first touch control component 2 to an N-th touch control component 2 tap the touch screen one by one. Referring to FIG. 3, controlling the plurality of telescopic mechanisms 1 to drive the plurality of touch control components 2 to alternately tap the touch screen 3 in sequence according to a preset order can be implemented by a processor, and the control unit 7 is a control component of the processor. For example, the control unit 7 can also control the number of times of stretch and contraction, the time, and the speed, etc., of the telescopic portions of the plurality of telescopic mechanisms 1, so as to correspondingly control the number of times, the time, and the speed of tapping the touch screen 3 by the plurality of touch control components 2, which is not limited here. By alternately tapping the touch screen 3, the acquisition unit 4 can acquire one actual detection coordinate point at a time, which can effectively ensure that the acquired actual detection coordinate points are accurate and reliable.

For example, the touch control test device provided by the embodiments of the present disclosure further includes a carrier 8. The carrier 8 is configured to place the touch screen 3. For example, a fixing structure may be arranged on the carrier 8 to fix the touch screen 3. The carrier 8 is suitable to be made to having a horizontal surface, so that the touch screen 3 can be horizontally placed on the carrier 8, and the touch screen 3 can be fixed. By controlling the moving mechanism 6 and the telescopic mechanism 1, the touch control interaction response test in which the touch control component 2 taps the touch screen 3 can be completed.

In the embodiments of the present disclosure, the touch control interaction test for the touch screen is further improved and perfected by achieving the tap touch control test for the touch screen, so as to help to provide more objective and fair results for the accuracy of the touch control test for the touch screen.

Figure 5:
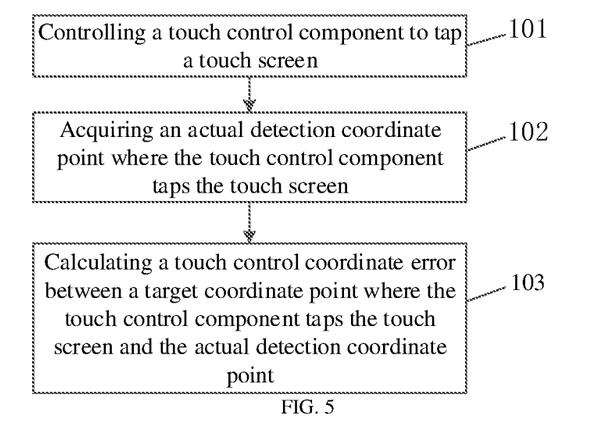
FIG. 5 is a flowchart of a touch control test method provided by an embodiment of the present disclosure.

As shown in FIG. 5, embodiments of the present disclosure provide a touch control test method, which includes the following step 101 to step 103.

Step 101: controlling a touch control component to tap a touch screen.

For example, the touch control test device of the above embodiments can be used to perform the tap touch control test on the touch screen. For example, referring to FIG. 1 and FIG. 2, the touch control test device includes: a telescopic mechanism 1 with an adjustable length, where for example, the telescopic mechanism 1 includes a main body and a telescopic portion connected with the main body, and the telescopic portion is configured to be telescopic and movable relative to the main body; a touch control component 2 connected with the telescopic portion of the telescopic mechanism 1, and the telescopic portion is configured to drive the touch control component 2 to tap the touch screen 3. The structure and the working principle of the touch control test device are the same as those in the above embodiments, and will not be described here again.

Step 102: acquiring an actual detection coordinate point where the touch control component taps the touch screen.

Referring to FIG. 1 and FIG. 2, in the case where the touch control component 2 taps the touch screen 3, the actual detection coordinate point on the touch screen 3 tapped by the touch control component 2 can be acquired by the acquisition unit 4. For example, the acquisition unit 4 can be a touch sensor, etc., or any other components capable of acquiring the actual detection coordinate points of touch, which is not limited here. After the touch control component 2 is located above the target coordinate point on the touch screen 3, the touch control component 2 is controlled to tap the touch screen 3, and the target coordinate point is a preset touch position, so that there will be a positional deviation between the actual detection coordinate point and the target coordinate point on the touch screen 3 tapped by the touch control component 2.

Step 103: calculating a touch control coordinate error between a target coordinate point where the touch control component taps the touch screen and the actual detection coordinate point.

For example, the touch control coordinate error between the actual detection coordinate point and the target coordinate point is the distance value between the two coordinate points. Referring to FIG. 1 and FIG. 2, this step can be completed by the calculation unit 5, for example, the calculation unit 5 can be a calculation logic component of a processor.

According to the touch control test method provided by the embodiments of the disclosure, the touch control component is controlled to tap the touch screen, the actual detection coordinate point on the touch screen tapped by the touch control component is acquired, and the touch control coordinate error between the target coordinate point on the touch screen tapped by the touch control component and the actual detection coordinate point is calculated, so as to achieve the tap touch control test for the touch screen, further improve and perfect the touch control interaction test for the touch screen, and help to provide more objective and fair results for the accuracy of the touch control test for the touch screen.

Figure 6:
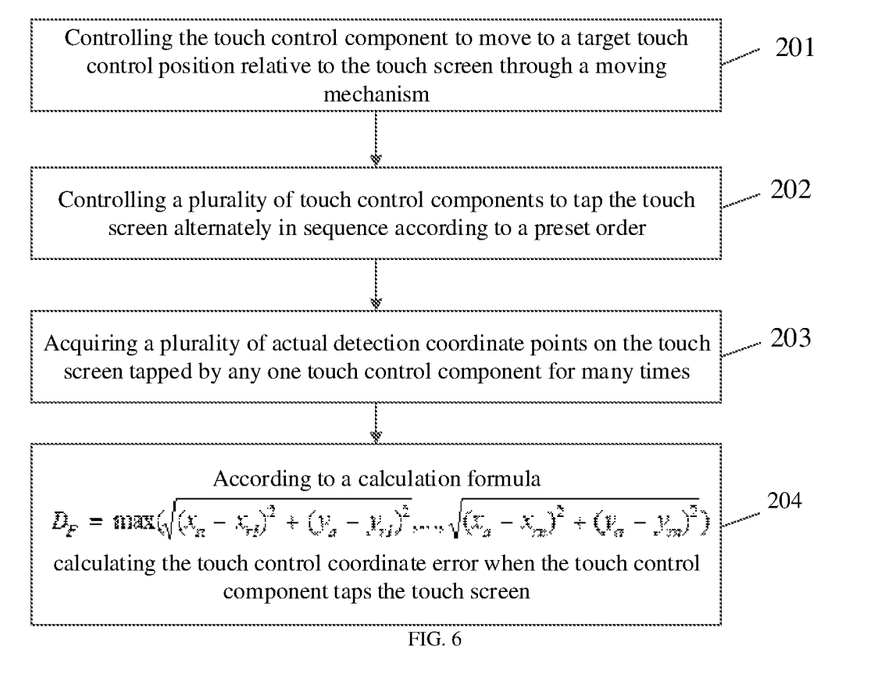
FIG. 6 is a flowchart of another touch control test method provided by an embodiment of the present disclosure.

For example, the accuracy of the touch control test can be improved by tapping the touch screen for many times. For example, as shown in FIG. 6, the touch control test method provided by the embodiments of the present disclosure includes the following step 201 to step 204.

Step 201: controlling the touch control component to move to a target touch control position relative to the touch screen through a moving mechanism.

The touch control test device of the above embodiments can be used to perform the tap touch control test on the touch screen. For example, referring to FIG. 1 and FIG. 2, the touch control test device includes a moving mechanism 6, a telescopic mechanism 1, and a touch control component 2, and the moving mechanism 6 is connected with the telescopic mechanism 1 for driving the telescopic mechanism 1 to move at least in a direction parallel to the touch screen 3. The touch control component 2 is connected with the telescopic mechanism 1, and the telescopic mechanism 1 is configured to drive the touch control component 2 to tap the touch screen 3. For example, according to the test requirements, the moving mechanism 6 drives the touch control component 2 connected with the telescopic mechanism 1 to move along a preset track. The moving mechanism 6 can at least move in a direction parallel to the touch screen. For example, the moving mechanism 6 can move at least in an x direction and a y direction. Or, on this basis, for example, the moving mechanism 6 can also be designed to move in the direction perpendicular to the touch screen 3, that is, a z direction, so as to adjust the height of the touch control component 2 from the touch screen 3. The moving mechanism 6 can drive the touch control component 2 to perform a scribing test on the touch screen 3, that is, to perform a touch control test along the parallel direction of the surface of the touch screen 3.

For example, the number of the touch control components 2 is plural. One moving mechanism 6 can drive the plurality of telescopic mechanisms 1 to move relative to the touch screen 3 at the same time, each of the plurality of telescopic mechanisms 1 is connected with one of the plurality of touch control components 2 to respectively control each of the plurality of touch control component 2 to tap the touch screen 3 to achieve multi-point tap touch control operation, and the actions of respective touch control components 2 tapping the touch screen 3 can be mutually unaffected.

Step 202: controlling a plurality of touch control components to tap the touch screen alternately in sequence according to a preset order.

Referring to FIG. 1, FIG. 2, and FIG. 3, this step can be completed by a control unit 7, for example, the control unit 7 can be a control component of a processor. The control unit 7 can control the plurality of telescopic mechanisms 1 to alternately stretch and contract in sequence according to a preset order, so as to drive corresponding touch control components 2 to alternately tap the touch screen 3 in sequence according to the preset order. For example, the control unit 7 can also control the number of times of stretch and contraction, the time, and the speed, etc., of the telescopic portions of the plurality of telescopic mechanisms 1, so as to correspondingly control the number of times, the time, and the speed of tapping the touch screen 3 by the plurality of touch control components 2, which is not limited here.

Step 203: acquiring a plurality of actual detection coordinate points on the touch screen tapped by any one touch control component for many times.

Referring to FIG. 1 and FIG. 2, in the case where the touch control component 2 is located above the target coordinate point on the touch screen 3, and taps the touch screen 3 for many times, the actual detection coordinate points are acquired. It should be noted that the target coordinate point for the touch control component 2 at the same touch control position relative to the touch screen 3 is unchanged.

Step 204: according to a calculation formula:

$$D_F = \max(\sqrt{(x_a-x_{r1})^2+(y_a-y_{r1})^2}, \ldots, \sqrt{(x_a-x_m)^2+(y_a-y_m)^2})$$

calculating the touch control coordinate error when the touch control component taps the touch screen. Where $x_a$ is the target coordinate point on the touch screen tapped by any one of the plurality of touch control components, $x_{r1}, \ldots, x_{rn}$ are a plurality of actual detection coordinate points, respectively.

That is to say, the error value of the touch control interaction response of each tap of a touch control component is calculated, and then the maximum value is taken as the touch control coordinate error when the touch control component taps the touch screen, so that the calculation result is more accurate and reliable.

According to the touch control test method provided by the embodiments of the disclosure, the touch control component is controlled to tap the touch screen, the actual detection coordinate point on the touch screen tapped by the touch control component is acquired, and the touch control coordinate error between the target coordinate point on the touch screen tapped by the touch control component and the actual detection coordinate point is calculated, so as to achieve the tap touch control test for the touch screen, further improve and perfect the touch control interaction test for the touch screen, and help to provide more objective and fair results for the accuracy of the touch control test for the touch screen.

The arrangement methods of the same components in the touch control test device and the touch control test method provided by the embodiments of the present disclosure can be cross-referenced.

What have been described above are only exemplary implementations of the present disclosure and are not used to limit the protection scope of the present disclosure, and the protection scope of the present disclosure is determined by the appended claims.

What is claimed is:

1. A touch control test device, comprising:
   a telescopic mechanism, wherein a length of the telescopic mechanism is adjustable;
   a touch screen;
   a touch control component, wherein the touch control component is connected with the telescopic mechanism, and the telescopic mechanism is configured to drive the touch control component to tap the touch screen;
   an acquisition unit, configured to acquire an actual detection coordinate point where the touch control component taps the touch screen; and
   a calculation unit, configured to calculate a touch control coordinate error between a target coordinate point and the actual detection coordinate point;
   for a single, particular target coordinate point, the telescopic mechanism is configured to drive the touch control component to tap the touch screen for a plurality of times;
   the acquisition unit is configured to acquire a plurality of actual detection coordinate points where the touch control component taps the touch screen for a plurality of times; and
   the calculation unit is configured to calculate a maximum value of distances between the single, particular target coordinate point and the plurality of actual detection coordinate points, respectively, and take the maximum value as the touch control coordinate error.

2. The touch control test device according to claim 1, wherein
   the telescopic mechanism comprises a main body and a telescopic portion connected with the main body, the telescopic portion is telescopic and movable relative to the main body, the touch control component is connected with the telescopic portion of the telescopic mechanism, and the telescopic portion is configured to drive the touch control component to tap the touch screen.

3. The touch control test device according to claim 2, further comprising:
   a moving mechanism, wherein the moving mechanism is connected with the main body of the telescopic mechanism, and the moving mechanism is configured to drive the main body to move at least in a direction parallel to the touch screen.

4. The touch control test device according to claim 3, wherein the touch control test device comprises a plurality of touch control components and a plurality of telescopic mechanisms, a quantity of the plurality of telescopic mechanisms is equal to a quantity of the plurality of touch control components, and the telescopic portion of each of the plurality of telescopic mechanisms is connected with one of the plurality of touch control components; and the main bodies of the plurality of telescopic mechanisms are all connected with one moving mechanism.

5. The touch control test device according to claim 4, wherein the touch control test device comprises a control unit, the plurality of telescopic mechanisms are respectively connected with the control unit, and the control unit is configured to control telescopic portions of the plurality of telescopic mechanisms to alternately stretch and contract in sequence according to a preset order, so as to drive the plurality of touch control components to alternately tap the touch screen in sequence according to the preset order.

6. The touch control test device according to claim 1, further comprising:

a moving mechanism, wherein the moving mechanism is connected with the telescopic mechanism, and the moving mechanism is configured to drive the telescopic mechanism to move at least in a direction parallel to the touch screen.

7. The touch control test device according to claim 6, wherein the touch control test device comprises a plurality of touch control components and a plurality of telescopic mechanisms, a quantity of the plurality of telescopic mechanisms is equal to a quantity of the plurality of touch control components, and each of the plurality of telescopic mechanisms is connected with one of the plurality of touch control components; and the plurality of telescopic mechanisms are all connected with one moving mechanism.

8. The touch control test device according to claim 7, wherein the touch control test device comprises a control unit, the plurality of telescopic mechanisms are respectively connected with the control unit, and the control unit is configured to control the plurality of telescopic mechanisms to alternately stretch and contract in sequence according to a preset order, so as to drive the plurality of touch control components to alternately tap the touch screen in sequence according to the preset order.

9. The touch control test device according to claim 1, wherein the touch control test device comprises a plurality of touch control components and a plurality of telescopic mechanisms, a quantity of the plurality of telescopic mechanisms is equal to a quantity of the plurality of touch control components, and each of the plurality of telescopic mechanisms is connected with one of the plurality of touch control components.

10. The touch control test device according to claim 1, further comprising:

a carrier, configured to place the touch screen thereon.

11. The touch control test device according to claim 1, wherein the telescopic mechanism comprises a main body and a telescopic portion connected with the main body, the telescopic portion is telescopic and movable relative to the main body, the touch control component is connected with the telescopic portion of the telescopic mechanism, and the telescopic portion is configured to drive the touch control component to tap the touch screen.

12. The touch control test device according to claim 11, further comprising:

a moving mechanism, wherein the moving mechanism is connected with the main body of the telescopic mechanism, and the moving mechanism is configured to drive the main body to move at least in a direction parallel to the touch screen.

13. The touch control test device according to claim 12, wherein the touch control test device comprises a plurality of touch control components and a plurality of telescopic mechanisms, a quantity of the plurality of telescopic mechanisms is equal to a quantity of the plurality of touch control components, and the telescopic portion of each of the plurality of telescopic mechanisms is connected with one of the plurality of touch control components; and the main bodies of the plurality of telescopic mechanisms are all connected with one moving mechanism.

14. The touch control test device according to claim 13, wherein the touch control test device comprises a control unit, the plurality of telescopic mechanisms are respectively connected with the control unit, and the control unit is configured to control telescopic portions of the plurality of telescopic mechanisms to alternately stretch and contract in sequence according to a preset order, so as to drive the plurality of touch control components to alternately tap the touch screen in sequence according to the preset order.

15. A touch control test method, comprising:

controlling a touch control component to tap a touch screen;

acquiring an actual detection coordinate point where the touch control component taps the touch screen, wherein for a single, particular target coordinate point, controlling the touch control component to tap the touch screen for a plurality of times, and acquiring a plurality of actual detection coordinate points where the touch control component taps the touch screen for a plurality of times; and calculating a touch control coordinate error between the single, particular target coordinate point and the plurality of actual detection coordinate points, wherein calculating a maximum value of distances between the single, particular target coordinate point and the plurality of actual detection coordinate points, respectively, and take the maximum value as the touch control coordinate error.

16. The touch control test method according to claim 15, wherein before controlling the touch control component to tap the touch screen, the touch control test method further comprises:

controlling the touch control component to move to a target touch control position relative to the touch screen through a moving mechanism.

17. The touch control test method according to claim 13, wherein the controlling of the touch control component to tap the touch screen comprises:
    controlling a plurality of touch control components to tap the touch screen alternately in sequence according to a preset order.

18. The touch control test method according to claim 17, wherein the acquiring of the actual detection coordinate point comprises:
    for the single, particular target coordinate point, acquiring a plurality of actual detection coordinate points where a single, particular touch control component taps the touch screen for a plurality of times;
    calculating the touch control coordinate error between the single, particular target coordinate point and the plurality of actual detection coordinate points comprises:
    according to a calculation formula:

$$D_F = \max(\sqrt{(x_a-x_{r1})^2+(y_a-y_{r1})^2}, \ldots, \sqrt{(x_a-x_m)^2+(y_a-y_{rm})^2}),$$

calculating the touch control coordinate error, wherein $x_a$ and $y_a$ are the target coordinate point where the touch control component taps the touch screen, and $x_{r1}, \ldots, x_{rm}$ and $y_{r1}, \ldots, y_{rm}$ are the plurality of actual detection coordinate points, respectively.

19. The touch control test method according to claim 15, wherein the acquiring of the actual detection coordinate point comprises:
    for the single, particular target coordinate point, acquiring a plurality of actual detection coordinate points where a single, particular touch control component taps the touch screen for a plurality of times;
    calculating the touch control coordinate error between the single, particular target coordinate point and the plurality of actual detection coordinate points comprises:
    according to a calculation formula:

$$D_F = \max(\sqrt{(x_a-x_{r1})^2+(y_a-y_{r1})^2}, \ldots, \sqrt{(x_a-x_m)^2+(y_a-y_{rm})^2}),$$

calculating the touch control coordinate error, wherein $x_a$ and $y_a$ are the target coordinate point where the touch control component taps the touch screen, and $x_{r1}, \ldots, x_{rm}$ and $y_{r1}, \ldots, y_{rm}$ are the plurality of actual detection coordinate points, respectively.

\* \* \* \* \*

UNITED STATES PATENT AND TRADEMARK OFFICE
CERTIFICATE OF CORRECTION

| | |
|---|---|
| PATENT NO. | : 11,698,407 B2 |
| APPLICATION NO. | : 17/047741 |
| DATED | : July 11, 2023 |
| INVENTOR(S) | : Li et al. |

It is certified that error appears in the above-identified patent and that said Letters Patent is hereby corrected as shown below:

In the Claims

On Column 13, Line 1 (Claim 17), please change:
"The touch control test method according to claim 13, …."
To correctly read:
-- The touch control test method according to claim 16, … --

Signed and Sealed this
Third Day of October, 2023

Katherine Kelly Vidal
*Director of the United States Patent and Trademark Office*